United States Patent [19]

Casey et al.

[11] Patent Number: 5,601,672

[45] Date of Patent: Feb. 11, 1997

[54] METHOD FOR MAKING CERAMIC SUBSTRATES FROM THIN AND THICK CERAMIC GREENSHEETS

[75] Inventors: Jon A. Casey; Dinesh Gupta, both of Poughkeepsie, N.Y.; James R. Wylder, Round Rock, Tex.

[73] Assignee: International Business Machines Corporation, Armonk, N.Y.

[21] Appl. No.: 333,010

[22] Filed: Nov. 1, 1994

[51] Int. Cl.6 .......................... B32B 31/12; B32B 31/26
[52] U.S. Cl. .......................... 156/89; 156/252; 264/61; 29/851; 174/255
[58] Field of Search .......................... 156/89; 264/60, 264/61; 29/832, 851; 174/255, 260; 361/313, 328, 329, 761, 762, 763

[56] References Cited

U.S. PATENT DOCUMENTS

| | | | |
|---|---|---|---|
| 2,759,854 | 8/1956 | Kilby . | |
| 4,567,542 | 1/1986 | Shimada et al. | 361/321.4 |
| 4,621,066 | 11/1986 | Nishigaki et al. . | |
| 4,752,857 | 6/1988 | Khoury et al. | 361/321.5 |
| 5,065,275 | 11/1991 | Fujisaki et al. . | |
| 5,099,388 | 3/1992 | Ogawa et al. . | |
| 5,144,526 | 9/1992 | Vu et al. | 361/321.1 |

FOREIGN PATENT DOCUMENTS 4233403  4/1994  Germany .

OTHER PUBLICATIONS

Lussow, R. O., "Internal capacitors and resistors for multi-layer ceramic modules," IBM Technical Disclosure Bulletin, vol. 20, No. 9 Feb. 1978.

Utsumi, Kazuaki, "Multilayer ceramic films," Hyomen Gijutsu, 40(10), 1989, 1075–80, (Abstract Only).

*Primary Examiner*—David A. Simmons
*Assistant Examiner*—M. Curtis Mayes
*Attorney, Agent, or Firm*—Perman & Green

[57] ABSTRACT

Method for producing ceramic laminates from a plurality of greensheet layers which include one or more thin greensheet layers, e.g. having a thickness less than about 3 mils, with interposed patterned circuit layers and conductive vias, while avoiding the loss of strength and the distortion encountered when paste compositions are pre-applied to such thin greensheet layers. The invention avoids the aforementioned problems by the use of a plurality of greensheet layers including thicker, paste-resistant greensheet layers having a thickness greater than the thin greensheet layer, e.g., between 5 and 10 mils, each pair of the thicker greensheet layers confining therebetween an unscreened thin greensheet layer, one of the thicker greensheet layers also being screened with the circuit pattern layer normally applied to the interposed thin greensheet layer. Thereafter the superposed layers are laminated and sintered to form the composite.

10 Claims, 1 Drawing Sheet

METHOD FOR MAKING CERAMIC SUBSTRATES FROM THIN AND THICK CERAMIC GREENSHEETS

BACKGROUND OF THE INVENTION

1. Field of the Invention

The present invention relates to the production of circuitized layers and multi-layer ceramic laminates for electronic application, and more particularly to the production of laminates from a plurality of dielectric ceramic greensheets patterned with conductive circuit layers interconnected by conductive vias to form multilayer sub-laminate units.

The increasing demands for miniaturization and greater electrical capacity of electronic components has created production and performance problems. For example, miniaturization requires the use of thinner insulating ceramic greensheet layers, finer-line printed circuit conductive layers and smaller, more precise vias or holes through each greensheet layer to receive conductive paste and connect predetermined fine-line circuitry of the patterned conductive layers spaced by the insulating greensheet layers.

Thin greensheet layers, less than about 3 mils in thickness, are difficult to process into multi-layer ceramic laminates in the conventional production process because the thin greensheets distort greatly and lose mechanical strength during normal processing, particularly during screening with conductive paste composition, and weakened, distorted or warped greensheets cannot be laminated into electrically-continuous packages.

2. Background Art

It is known to produce multi-layer ceramic laminates and composites thereof for electronic applications, and reference is made to U.S. Pat. Nos. 4,349,862; 4,799,984; 4,894,258; 4,929,295; 5,089,455 and 5,232,765. U.S. Pat. No. 5,232,765 prevents or reduces distortion or shrinkage of the greensheet ceramic layers by maintaining pressure on the laminates during firing. U.S. Pat. No. 4,799,984 employs a rigid substrate as a support for the build-up of pre-punched greensheet layers and conductive layers during the production of multi-layer ceramic laminates. The substrate is retained in the process of U.S. Pat. No. 4,799,984 to become an integral part of the formed MLC. In typical prior-known processes, the individual greensheets are each screened prior to stacking and lamination.

SUMMARY OF THE INVENTION

The present invention provides a novel method for producing ceramic laminates from a plurality of greensheet layers which include one or more thin greensheet layers having a thickness less than about 3 mils, with interposed patterned circuit layers and conductive vias, while avoiding the loss of mechanical strength and the distortion generally encountered when the paste compositions used for forming the circuit layers and vias are pre-applied to such thin greensheet layers. The present invention avoids the aforementioned problems and disadvantages by the use of a plurality of greensheet layers including thicker, distortion-resistant greensheet layers having a thickness greater than about 5 mils, a pair of said thicker greensheet layers confining therebetween an unscreened thin greensheet layer, one of said thicker greensheet layers also being screened with the circuit pattern layer normally applied to the interposed thin greensheet layer. Thereafter the superposed layers are laminated and sintered to form the composite including the thin greensheet layers which are patterned during the lamination and sintering operation without distortion or loss of mechanical strength.

THE DRAWINGS

FIG. 1 is a diagrammatic cross-sectional view of a plurality of via-containing ceramic greensheets, including circuit-patterned greensheets having a distortion-resistant thickness, and interposed unpatterned paste-distortable thin greensheets, aligned for lamination but spaced for purposes of illustration; and FIG. 2 is a similar view of the composite formed from the sheets of FIG. 1 after lamination and sintering.

DETAILED DESCRIPTION

Figure 1:
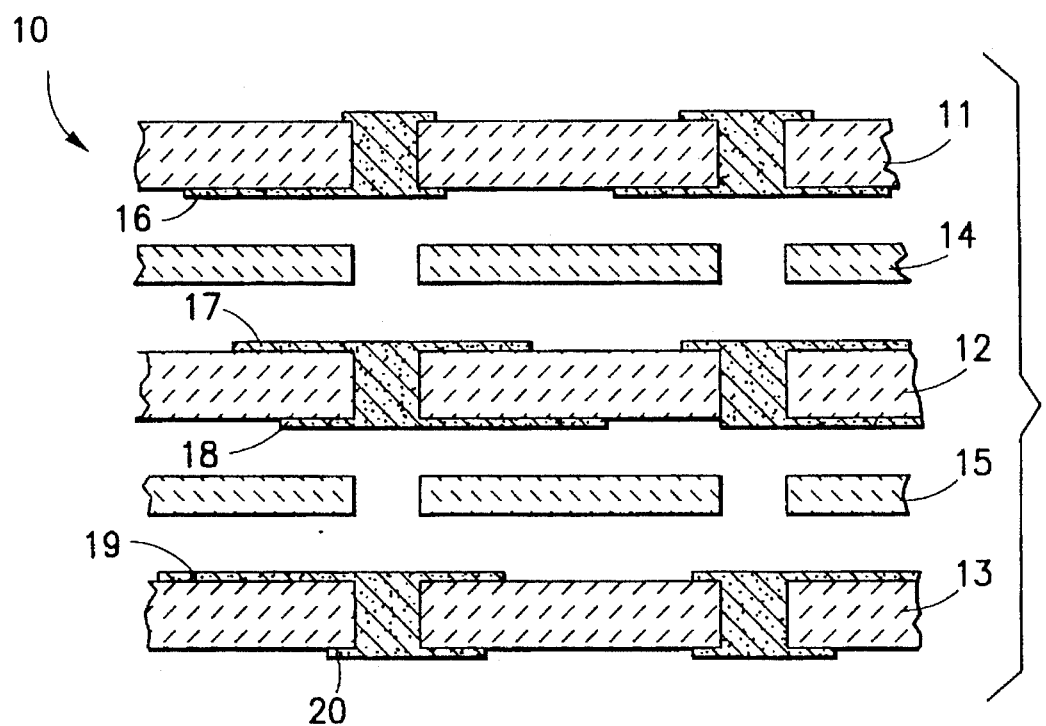

Referring to FIG. 1, the assembly 10 of greensheets comprises circuited and via-filled greensheet layers 11, 12 and 13 of conventional thicknesses having interposed therewith unpatterned thin greensheet layers 14 and 15. Each of the greensheet layers is pre-punched with vias, and the thicker greensheet layers 11, 12 and 13 have been printed and screened with conventional conductive paste compositions to fill the vias and form the pattern conductive layers 16, 17, 18, 19 and 20 thereon, the thicker greensheet layers being sufficiently strong to receive said paste layers without being distorted or having their mechanical strength reduced.

The thin greensheet layers 14 and 15, which normally would be distorted or weakened by the application of the conductive printing pastes thereto, are protected against these weaknesses by not having the conductive paste composition pre-applied directly thereto. This is made possible by the discovery that the paste for the circuit layer 17 and 19 and for the via-fill of the thin greensheet layers 14 and 15 can be applied to the thicker paste-resistant greensheet layers 12 and 13, respectively, and dried prior to the lamination and sintering steps, to form the composite 21 of FIG. 2.

Figure 2:
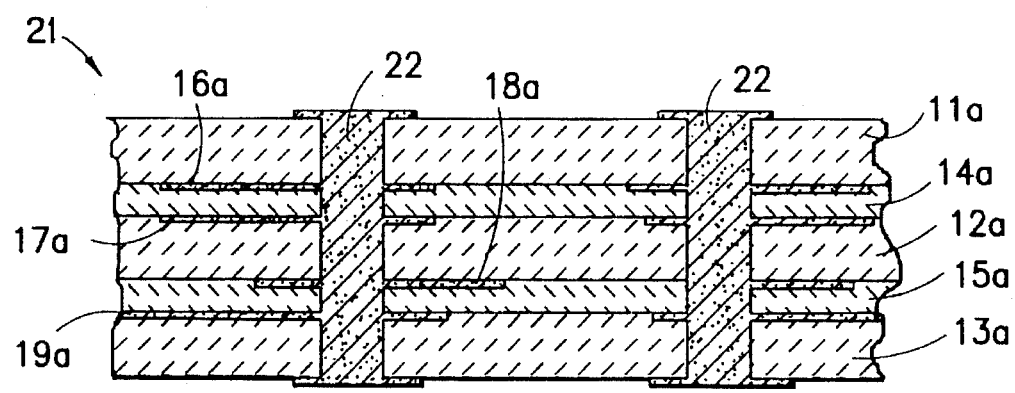

As shown in FIG. 2, the lamination and sintering steps bond the circuit layers 17 and 19, present on thicker layers 12 and 13, respectively, to the interface surfaces of the thin greensheet layers 14 and 15, respectively and cause the paste to fill the vias in said thin layers and form an integrated ceramic composite including thin layers of sintered greensheet material without the necessity of preprinting the conductive metal paste directly onto the thin layers 14 and 15, with resultant distortion or weakening.

The present invention relates to a process for forming a multi-layer ceramic substrate from a plurality of ceramic greensheet layers including at least one thin greensheet layer interposed between a pair of thicker greensheet layers. In the first step the process comprises obtaining a plurality of ceramic sheets in the green state. These ceramic layers may be obtained by mixing a ceramic material or several ceramic materials with suitable organic binders, plasticizers, solvents and other conventional additives (hereinafter the binder composition) to obtain a castable slip or slurry from which the thin sheets and the thicker sheets were cast using conventional doctor blading techniques. A particularly preferred binder material is polyvinyl butyral resin. Thereafter each of the greensheets is punched or machined to form vias therethrough, and a conductive metal pattern is deposited on each of the thicker green ceramic sheets. The conductive metal pattern may be deposited by any convenient method, such as screening, as is well known to those skilled in the art. The conductive metal pattern forms the internal circuitry of the finished substrate. According to a novel step of the present invention, the thin greensheet layers 14 and 15 of FIG. 1, which are susceptible to loss of mechanical strength and breakdown into pieces during handling if directly printed or coated with the conductive metal pastes, are not directly printed or coated with the conductive metal paste. Instead, the metal paste pattern or layer for each thin greensheet layer such as circuit layers 17 and 19, is applied to the adjacent surface of a thicker paste-resistant greensheet layer 12 and 13, respectively, which layer also has applied to the opposite surface thereof its own metal paste pattern or layer such as 18 and 20, respectively.

Thereafter the method comprises the steps of stacking and laminating the green ceramic sheets so as to form a substrate and then sintering the substrate to form the composite 21 illustrated in FIG. 2.

It is expected that a number of ceramic materials will work satisfactorily with the process according to the invention. Among there ceramic materials, just to name a few are aluminua, mullite, glass ceramics and aluminum nitride. However, a preferred material is alumina, $Al_2O_3$. Also preferred for use in the invention are the glass ceramic materials which are disclosed in Kumar et al. U.S. Pat. Nos. 4,301,324 and 4,413,061 which are incorporated by reference herein. Of the glass ceramics disclosed in the Kumar et al. patents the preferred glass ceramics are those of the spodumene and cordierite type glass ceramics. A common feature of these sintered glass ceramics among others is their excellent sinterability and crystallization below about 1000° C., and their low dielectric constants The sintering temperature for the alumina ceramics is in excess of about 1400° C. The sintering temperature of the substrate must be adjusted according to the ceramic material used in the substrate, as is well known to those skilled in the art.

Thereafter each patterned greensheet layer is heated while pressure is applied thereto. Generally, the step of heating is within the range of about 60°–90° C., which is a temperature just sufficient to soften the organic binder composition. Generally, the step of pressing is between about 500 to 5000 pounds per square inch (psi) which is just sufficient to press the conductive metal pattern into the softened green sheet and into the vias. The pressure will normally be applied for about 30 to 120 seconds. The temperatures, pressure and times will vary somewhat depending on the constitution of the binder composition. Thus, the temperatures, pressures and times specified above are to be considered as guides for the proper application of the invention and may be adjusted as appropriate.

As illustrated by FIG. 2, the formation of the composite 21 causes the circuit layer 17, carried on the thick greensheet 12, and the circuit layer 19 carried on the thick greensheet 13, to be sealed as metal patterns 17a and 19a at the interfaces between sintered sheets 12a and 14a and sheets 13a and 15a, respectively, and to be exuded up into the open vias in the sintered thin sheets 14a and 15a to interconnect with the metal patterns 16a and 18a resulting from circuit layers 16 and 18, respectively, which are exuded down into the open vias in the sintered thin sheets 14a and 15a. The formed composite 21 has the same structure and functionality as one formed from individually—circuited greensheet layers but is miniaturized by the incorporation of one or more thin greensheet layers while avoiding the processing problems normally encountered with the use of thin greensheet layers.

The thin greensheet layers used according to the present invention generally have a thickness less than about 3 mils (0,003 inch) and preferably less than about 2 mils, and down to minimum thickness capable of being processed, e.g., about 0.25 mil. The thicker greensheet layers are those capable of being printed or coated with the conductive paste compositions on both surfaces without loss of mechanical strength. Such greensheet layers have a thickness greater than the thin greensheet layers and preferably greater than about 5 mils (0.005 inch), and up to any thickness conventionally used to form ceramic substrates and composites of the present type. For purposes of miniaturization it is preferred to use thicker greensheet layers having the thicknesses on the lower end of the scale, i.e., between about 5 and 10 mils.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. Method for making multilayer ceramic substrates from a plurality of dielectric ceramic greensheet layers patterned with paste-applied conductive circuit layers interconnected by paste-applied conductive vias, including at least one thin dielectric ceramic greensheet layer having a thickness less than about 3 mils which is susceptible to undergoing distortion and loss of mechanical strength if conductive paste is applied directly thereto, comprising the steps of producing a plurality of thick dielectric ceramic greensheet layers and at least one said thin greensheet layer, wherein said thick dielectric ceramic greensheet layers are thicker than said at least one thin greensheet layer, forming vias in each of said greensheet layers; applying conductive metal paste to at least the undersurface of one of said thick greensheet layers and to at least the upper surface of another of said thick greensheet layers to fill the vias and form conductive circuit layers thereon; drying said filled vias and circuit layers; interposing a said thin greensheet layer, which is devoid of conductive metal paste, between a pair of said thick greensheet layers so that the opposed surfaces of said thin greensheet layer each contact a said dried conductive circuit layer present on a said thick greensheet layer; and laminating and sintering said layers to form a multi-layer ceramic substrate having a conductive circuit layer present between each of said greensheet layers and having conductive vias interconnected therewith.

2. Method according to claim 1 in which each said thick greensheet layer has a thickness of at least about 5 mils.

3. Method according to claim 1 in which each said thin greensheet layer has a thickness less than about 2 mils.

4. Method according to claim 1 which comprises producing at least two said thin greensheet layers, and interposing each of said thin layers between two said thick greensheet layers, at least one of said thicker greensheet layers having conductive paste applied to both surfaces thereof to form conductive circuit layers on both surfaces.

5. Method according to claim 1 in which said ceramic greensheet layers comprise alumina.

6. Method for making multilayer ceramic substrates from a plurality of dielectric ceramic greensheet layers patterned with paste-applied conductive circuit layers interconnected by paste-applied conductive vias, including at least one thin dielectric ceramic greensheet layer having a thickness less than about 3 mils which normally undergoes distortion and loss of mechanical strength when conductive paste is applied directly thereto, comprising the steps of: producing a plurality of thick dielectric ceramic greensheet layers having a thickness of at least about 5 mils and at least one said thin greensheet layer, forming vias in each of said greensheet layers; applying conductive metal paste to at least the undersurface of one of said thick greensheet layers and to at least the upper surface of another of said thick greensheet layers to fill the vias and form conductive circuit layers thereon; drying said filled vias and circuit layers; interposing a said thin greensheet layer, which is devoid of conductive metal paste, between a pair of said thick greensheet layers so that the opposed surfaces of said thin greensheet layer each contact a said dried conductive circuit layer present on a said thick greensheet layer; and laminating and sintering said greensheet layers to form a multi-layer ceramic substrate having a conductive circuit pattern present between each of said greensheet layers and having conductive vias interconnected therewith.

7. Method according to claim 6 in which each said thick greensheet layer has a thickness between about 5 and 10 mils.

8. Method according to claim 6 in which each said thin greensheet layer has a thickness less than about 2 mils.

9. Method according to claim 6 which comprises producing at least two said thin greensheet layers, and interposing each of said thin layers between two said thick greensheet layers, at least one of said thick greensheet layers having conductive paste applied to both surfaces thereof to form conductive circuit layers on both surfaces.

10. Method according to claim 6 in which said ceramic greensheet layers comprise alumina.

* * * * *